United States Patent
Okai et al.

(10) Patent No.: US 8,125,518 B2
(45) Date of Patent: Feb. 28, 2012

(54) SCANNING ELECTRON MICROSCOPE

(75) Inventors: Nobuhiro Okai, Kokubunji (JP); Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/139,315

(22) PCT Filed: Nov. 24, 2009

(86) PCT No.: PCT/JP2009/006315
§ 371 (c)(1),
(2), (4) Date: Jun. 13, 2011

(87) PCT Pub. No.: WO2010/070815
PCT Pub. Date: Jun. 24, 2010

(65) Prior Publication Data
US 2011/0249110 A1    Oct. 13, 2011

(30) Foreign Application Priority Data
Dec. 15, 2008   (JP) ................................. 2008-318305

(51) Int. Cl.
H04N 9/47 (2006.01)
(52) U.S. Cl. .......................................... 348/80
(58) Field of Classification Search ............... 348/78–81
See application file for complete search history.

(56) References Cited

U.S. PATENT DOCUMENTS

| | | | | |
|---|---|---|---|---|
| 4,907,287 A | * | 3/1990 | Homma et al. | 382/255 |
| 5,051,585 A | * | 9/1991 | Koshishiba et al. | 850/9 |
| 5,130,540 A | * | 7/1992 | Yamada et al. | 250/310 |
| 6,448,555 B1 | | 9/2002 | Hosokawa | |
| 6,734,687 B1 | * | 5/2004 | Ishitani et al. | 324/750.19 |
| 7,881,558 B2 | | 2/2011 | Yamaguchi et al. | |
| 2003/0111602 A1 | | 6/2003 | Sato et al. | |
| 2006/0243905 A1 | | 11/2006 | Yamaguchi et al. | |

FOREIGN PATENT DOCUMENTS

| | | |
|---|---|---|
| JP | 59-224038 A | 12/1984 |
| JP | 5-290787 A | 11/1993 |
| JP | 2000-106121 A | 4/2000 |
| JP | 2000-294185 A | 10/2000 |
| JP | 2003-86126 A | 3/2003 |
| JP | 2006-308471 A | 11/2006 |
| WO | 03/044821 A1 | 5/2003 |

* cited by examiner

Primary Examiner — David Czekaj
(74) Attorney, Agent, or Firm — Mattingly & Malur, PC

(57) ABSTRACT

Provided is a scanning electron microscope including: an image recording unit (112) which stores a plurality of acquired frame images; a correction analyzing handling unit (113) which calculates a drift amount between frame images and a drift amount between a plurality of field images constituting a frame image; and a data handling unit (111) which corrects positions of respective field images constituting the plurality of fields images according to the drift amount between the field images and superimposes the field images on one another so as to create a new frame image. This provides a scanning electron microscope which can obtain a clear frame image even if an image drift is caused during observation of a pattern on a semiconductor substrate or an insulating object.

14 Claims, 9 Drawing Sheets

FIG. 3A
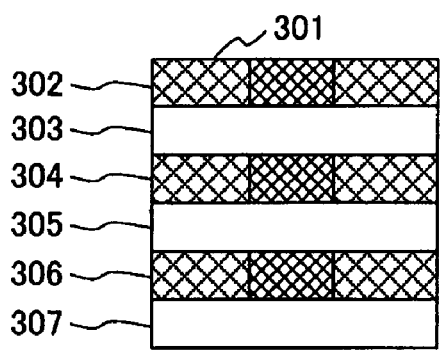
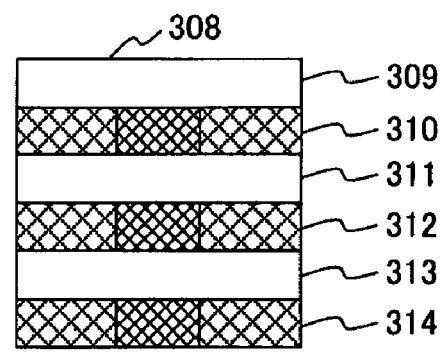
FIG. 3B
FIG. 3C
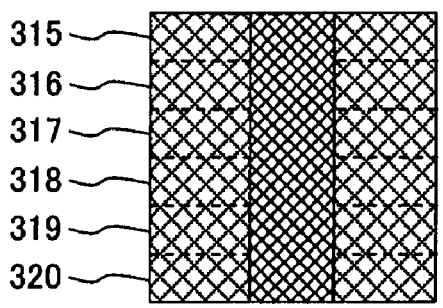
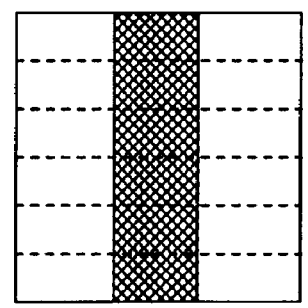

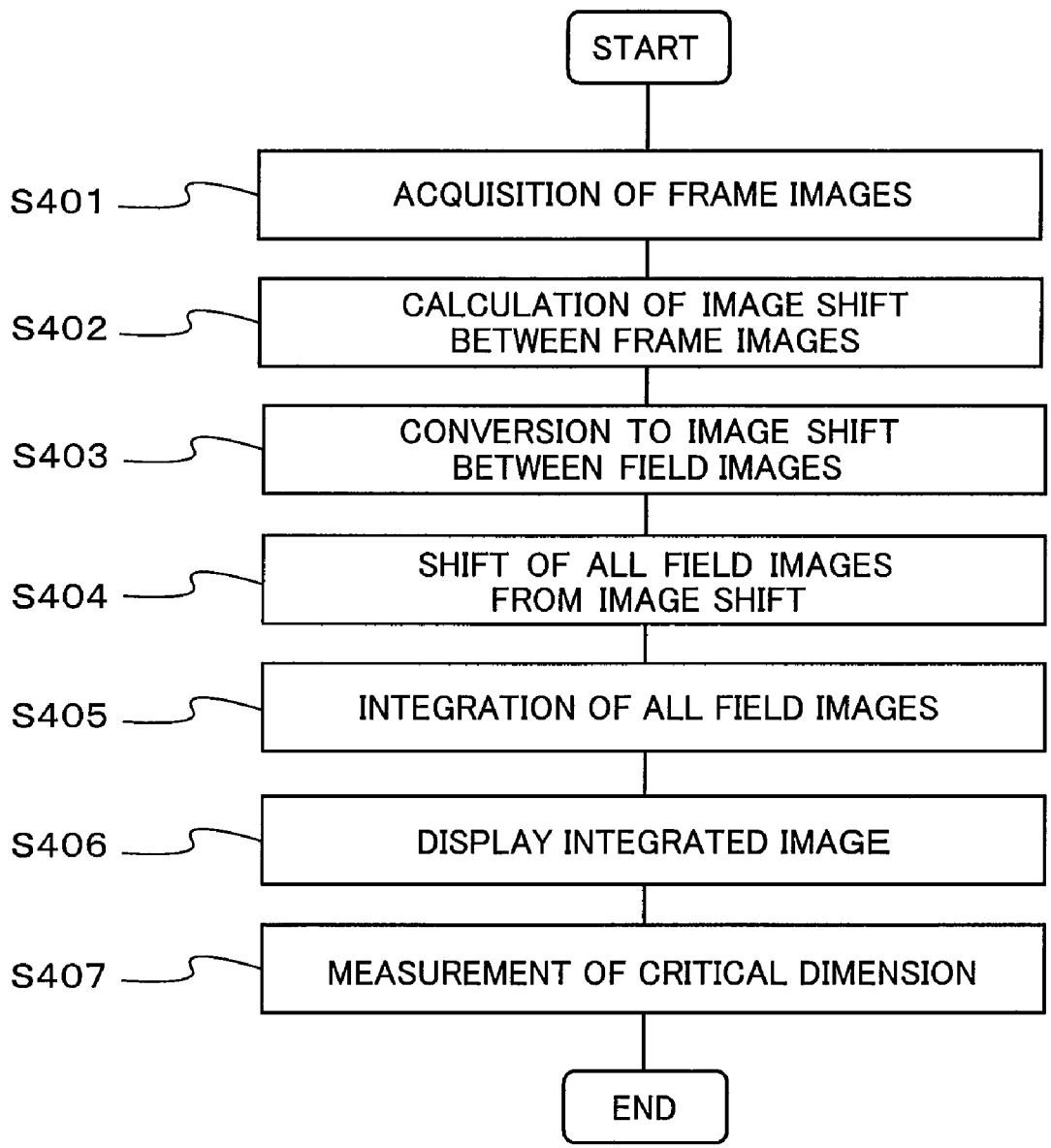

POSITION OF PATTERN IN N FRAME IMAGE

POSITION OF PATTERN IN FIRST FRAME IMAGE

N FRAME IMAGE

K FIELD IN N FRAME IMAGE (N+1) FRAME IMAGE

FIG. 9

```
SET DRIFT CORRECTION CONDITIONS

DRIFT CORRECTION

● YES      ○ NO

SELECTION OF CORRECTION METHOD

○ FRAME CORRECTION

● FIELD CORRECTION

FIELD NUMBER  [ 2 ]

[ OK ]    [ Default ]    [ Cancel ]
```

SCANNING ELECTRON MICROSCOPE

FIELD OF THE INVENTION

The present invention relates to a scanning electron microscope, and, more particularly, to a scanning electron microscope suitable for observing images at high magnification.

DESCRIPTION OF THE RELATED ART

Those scanning electron microscopes are systems for forming images. Specifically, a sample is irradiated with an electron beam which has been finely narrowed, and a secondary electron and a backscattered electron generated by the irradiation of the electron beam are detected. Based on the detection amount, the contrast is modulated, thereby forming images (see Japanese Patent Application Laid-Open Publication No. 2006-308471).

SUMMARY OF THE INVENTION

In recent years, the pattern dimensions formed on a semiconductor substrate or insulating substrate are made more and more finely. Thus, it is required that the observation and critical dimension measurement should be done at high magnification, using the scanning electron microscope.

When a sample is observed at high magnification, what is so-called image drift occurs. This image drift is a phenomenon that an image with a fine pattern to be observed shifts with time. This causes a problem such as image blur, resulting in a decrease in measurement precision. For example, if a frame image of 512×512 pixels is to be acquired at observation magnification of a hundred thousand times, the size of one pixel is approximately 2.6 nm on the sample. It is required that the calculation precision of the dimensions is presently 0.5 nm or lower. However, in the pattern with noticeable image drift, image drift of approximately 1 to 2 nm is observed in a period of time (40 milliseconds) for acquiring one frame image. If the dimensions are obtained in this drift pattern, a dimension gap of approximately 2 nm is generated. The major factor of generating image drift is the charging of the sample due to the irradiation of the electron beam.

Japanese Patent Application Laid-Open Publication No. 2006-308471 discloses an image correction and accumulation method. According to this technique, while a stage on which a sample is put is moved, images (frame images) of the sample surface are acquired. For this acquisition, when acquiring an accumulated image, the plural acquired images (frame images) are divided into groups of several images so as to form accumulated images of the groups. In addition, the image shift rate between the accumulated images is obtained, and a relationship between the image shift rate and the number of photographed images is obtained. Further, based on the obtained relationship, the image shift rate between the plural images is obtained, and finally the images are corrected and accumulated by the obtained image shift rate. With this technique, accumulated images with only a little image blur can be obtained even if the images are moved in the observation field by moving the stage.

However, according to the technique for correcting the image shift rate between the images (frame images) disclosed in Japanese Patent Application Laid-Open Publication No. 2006-308471, it is found that clear images cannot sufficiently be obtained with sufficient measurement precision, due to the occurrence of an image blur at high magnification (particularly, it is remarkable at or below approximately 1 micron of the observation field).

An object of the present invention is to provide a scanning electron microscope which can obtain clear images even with occurrence of image drift, when observing the sample surface at high magnification. Another object thereof is to provide a scanning electron microscope which can obtain the pattern dimensions formed on the sample surface with high accuracy, based on the obtained clear image.

In order to obtain clear images, even with occurrence of image drift, there is provided a scanning electron microscope which scans an electron beam, irradiates the electron beam onto a sample, and detects a signal emitted from the sample so as to form an image, the microscope including: an image recording unit which stores plural frame images each of which is acquired by scanning an observation field of the sample once; a correction analyzing handling unit which obtains a drift rate between the frame images and a drift rate between the field images included in each of the frame images; and a data handling unit which corrects the drift of the field images based on the drift rate between the field images, and superimposes the field images.

In order to measure the pattern dimensions formed on the surface of the sample with high accuracy even with occurrence of image drift, there is provided a scanning electron microscope which includes an electron beam source, a deflector which scans an electron emitted from the electron beam source, a sample holder on which a sample is put, and a display unit which displays an image based on a signal emitted from the sample, by the electron being irradiated onto the sample on the sample holder, and the microscope including: an image recording unit which stores plural frame images acquired by the electron being irradiated to an observation field of the sample as an area to be observed; a correction analyzing handling unit which obtains a drift rate between the plural frame images and a drift rate between plural field images included in each of the frame images; and a data handling unit which corrects drift of the field images based on the drift rate between the field images, and superimposes the field images so as to form a new frame image, wherein the data handling unit has a function for obtaining target pattern dimensions to be observed formed on the sample, based on data of the new frame image.

Clear images can be obtained even at high magnification. Specifically, the image drift rate (shift rate) of field images included in a frame image, and the field images are corrected, thereafter accumulating the field images so as to form a frame image. Based on the obtained image, the pattern dimensions on the semiconductor substrate or insulating substrate are obtained. Thus, the measurement precision can sufficiently be achieved even with fine patterns.

The frame image and field image will specifically be defined later.

BRIEF DESCRIPTION OF THE DRAWINGS

FIG. 3A is a diagram showing a field image in interlaced scanning, FIG. 3B is a diagram showing a frame image in one scanning, and FIG. 3C is a diagram showing an image in which plural images are superimposed, all being acquired in the scanning electron microscope;

FIG. 4 is a flowchart showing the flow of drift correction;

FIG. 9 is a diagram showing an example of a GUI for setting conditions for drift correction;

DETAILED DESCRIPTION OF THE INVENTION

Embodiments of the present invention will now specifically be described.

First Embodiment

The first embodiment of the present invention will now be described with reference to the drawings.

Figure 1:
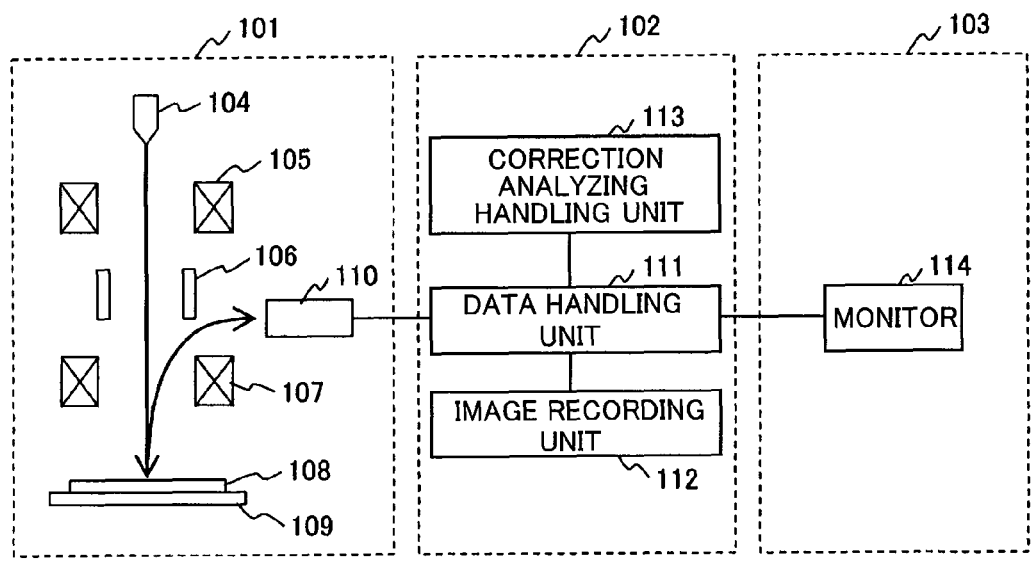
FIG. 1 is a diagram showing an embodiment of a scanning electron microscope including an image drift correction analyzing unit, according to the present invention.

FIG. 1 shows an embodiment of a scanning electron microscope including a drift correction function. This apparatus makes it possible to acquire clear frame images by calculating a drift rate and correcting drift, even if the image drift occurs. The image drift is a phenomenon that the images shift with time at observation of a sample. In this description, the "drift rate" implies the amount of positional deviation (shift rate) of patterns between frame images shown in FIG. 2 and also the shift rate between field images.

The scanning electron microscope including an image correction function includes an electron microscope unit 101, a control unit 102, and a display unit 103. An electron beam emitted from an electron source 104 is focused by a condenser lens 105 and an objective lens 107, then irradiated onto a sample 108. The electron beam is scanned two-dimensionally over the sample, by a deflector 106. The secondary electron(s) and backscattered electron(s) generated from the sample are detected by a detector 110, and the magnitude of the detected signal is modulated by a data handling unit 111 so as to obtain a transformed frame image. The transformed frame image is stored in an image recording unit 112. The frame image stored in the image recording unit 112 is corrected for drift in a correction analyzing handling unit 113, and the corrected image is displayed on a monitor 114. Functions of a data handling unit 111 and the correction analyzing handling unit 113 are executable by the CPU, and the image recording unit 112 may be provided in a memory unit connected to the CPU. Each of the units may include dedicated hardware.

In the measurement using the scanning electron microscope, a frame image is used. This frame image is obtained generally by scanning the observation field for plural times. This measurement is calculation of pattern dimensions formed on, for example, a semiconductor wafer. The frame image, which has been obtained by scanning a sample for plural times, has a high level of dimensional accuracy. This is because the frame image has a desirable S/N ratio, as compared with a frame image which has been obtained by a single scanning operation. However, if the charging of the sample progresses during the scanning, the scanning position deviates due to the charging. This results in a blurred image. A high level of dimensional accuracy is not guaranteed, even if the dimensions are calculated using the blurred image. Thus, the frame images of the respective scanning operations are corrected and superimposed, using the image processing. As a result, a clear frame image can be obtained by the scanning performed for plural times. Reticle is an example of an insulator substrate that is a sample to be remarkably charged.

Figure 2A:
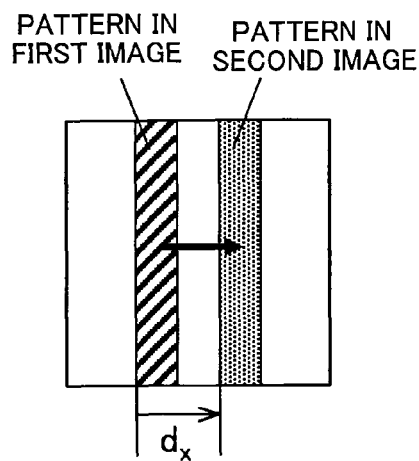
FIG. 2A is a schematic diagram of the drift in a line pattern.
Figure 2B:
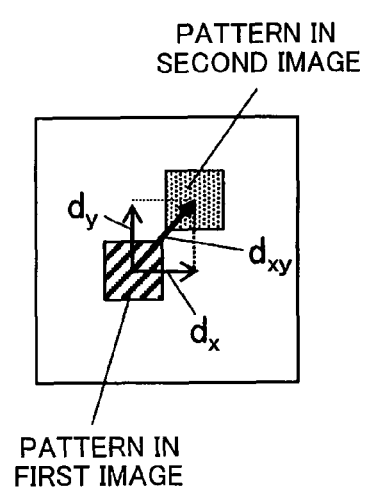
FIG. 2B is a schematic diagram of the drift in a dot pattern, as a subject of the present invention.

Before decrypting the steps of the drift correction in this configuration, descriptions will now be made of the drift rate between frame images with reference to FIG. 2A and FIG. 2B. In FIG. 2A and FIG. 2B, the observation patterns are classified one-dimensionally and two-dimensionally so as to define the drift rate. In this case, the one-dimensional pattern is nearly a uniform pattern in a particular direction of the frame image. For example, the one-dimensional pattern is the line pattern shown in FIG. 2A. The two-dimensional pattern corresponds to all patterns except the one-dimensional pattern, and an example of the two-dimensional pattern is the dot pattern shown in FIG. 2B. FIG. 2A and FIG. 2B illustrate the superimposed first and second frame images so that the positional relationship of the patterns is obviously shown.

In the line pattern of FIG. 2A, the drift rate cannot be calculated if the drift progresses in the longitudinal direction of the line. Thus, the drift rate is calculated perpendicularly to the longitudinal direction. In this case, the second pattern shifts to the right from the first pattern, and the shift rate $d_x$ corresponds to the drift rate. In the dot pattern of FIG. 2B, the drift is in the two-dimensional direction. In this case, the second pattern shifts to the upper right from the first pattern, and the shift rate $d_{xy}$ corresponds to the drift rate. The drift rate $d_{xy}$ can be resolved into the drift rate $d_x$ in the longitudinal direction and the drift rate $d_y$ in the perpendicular direction of the frame image. For the drift correction, the second frame image is shifted by thus obtained drift rate, so as to be superimposed on the first frame image.

Descriptions will now be made of the kinds of images obtained by the scanning electron microscope, in combination with an image forming process. The kinds of images are classified as frame images and field images. By definition, the frame image is obtained by scanning the entire observation field once, while the field image is obtained by scanning a part of the field, that is, an elemental image included in the frame image. The frame image is composed of the entire field images.

Descriptions will now be made of the classification of images obtained using interlaced scanning as one typical scanning method. For the sake of simplicity, the number of lines in an image is six. The interlaced scanning is a method for forming an image by scanning odd number lines of an image sequentially from the top thereof, thereafter scanning even number lines of the image sequentially from the top.

FIG. 3A shows a field image using the interlaced scanning. In the interlaced scanning, first, an odd number field image 301 and an even number field image 308 are acquired. The image 301 is obtained by scanning only the odd number lines, while the even number field image 308 is obtained by scanning only the even number lines. The odd number field image 301 includes images on scanned odd number lines 302, 304 and 306, with no images on even number lines 303, 305 and 307. The even number field image 308 includes images on scanned even number lines 310, 312 and 314, with no images on odd number lines 309, 311 and 313.

The one frame image of FIG. 3B is composed of the odd number field images and the even number field images. It is possible to understand the pattern form of a one-frame image shown in FIG. 3B. The one-frame image has an undesirable S/N ratio, because the image is formed using a signal obtained by scanning the observation field only once, and thus is not suitable for its pattern observation as is. Therefore, the same observation field is repeatedly scanned, and plural the one-frame images of FIG. 3B are continuously obtained. The obtained images are superimposed, thereby forming a plural-frame image of FIG. 3C with reduced noise and an improved S/N ratio. The plural-frame image of FIG. 3C is used for the pattern observation and measurement, and is generally called an SEM image.

Descriptions will now be made of an image correction system for use in the scanning electron microscope of FIG. 1 according to the embodiment of the present invention, with reference to the flowchart of FIG. 4.

First, a stage (sample holder) 109 is moved to an observation point. Then, plural one-frame images are continuously acquired in the same field of view (FOV), in a state where the position of the stage 109 is fixed. In this case, the one-frame image is composed of plural field images. The acquired frame images are stored in the image recording unit 112 (S401).

Now, the correction analyzing handling unit 113 is used for calculating (analyzing) the drift rate between images of and after the second frame image, based on the first frame image as a reference image (S402).

The correction analyzing handling unit 113 is used for converting the drift rate calculated in S402 into a drift rate between field images included in the frame image (S403).

The correction analyzing handling unit 113 is used for shifting the field image(s) by the drift rate calculated in S403 (S404).

Thus shifted field image(s) are superimposed on the reference field image, so as to form a new frame image (S405). The reference field image will specifically be described below.

The plural frame images formed in S405 are displayed on the monitor 114 (S406).

After that, the pattern dimensions are calculated using the plural frame images displayed on the monitor 114 (S407).

Figure 5A:
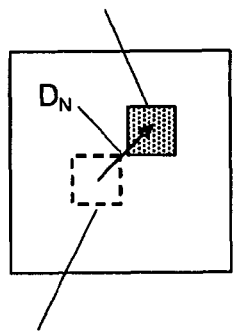
FIG. 5A is a diagram showing an image in which a first frame image and an N frame image are superimposed without being drift-corrected.
Figure 5B:
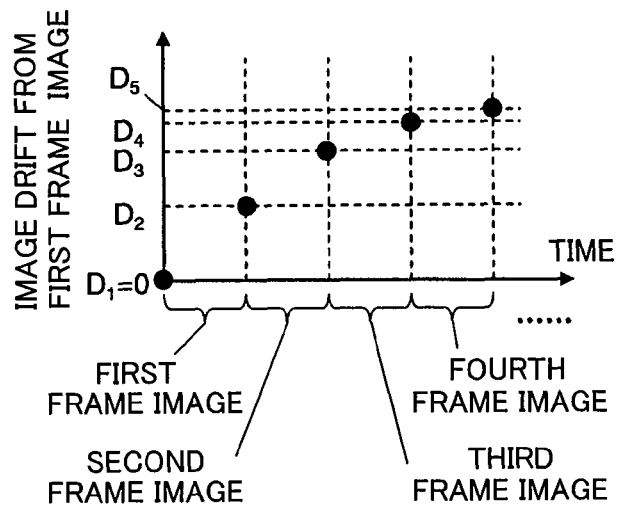
FIG. 5B is a diagram showing the relationship between elapsed times (since the beginning of image acquisition) and amounts of image drift, and both showing an image drift calculation method between frame images.

Descriptions will now specifically be made of a step S402 for calculation of image drift for each frame in this embodiment, with reference to FIG. 5A and FIG. 5B. FIG. 5A shows an example in which the first frame ($1^{st}$ F) image and the N frame image are superimposed and displayed. The drift rate between the frame images is calculated based on the amount of positional deviation of patterns, and is identified as $D_N$. As a process for calculating the drift rate, an applicable method is a phase correlation method for enabling to perform calculation for images with a low S/N ratio with high accuracy. However, the calculation method is not limited to this, and it is possible to apply an image calculation method for calculating the amount of positional deviation between images.

FIG. 5B shows an example of a graph in which a vertical axis represents the drift rate $D_N$ from the first frame image, and a horizontal axis represents the elapsed time (number of images) since the beginning of image acquisition. In the illustration, the amount of deviation $D_N$ of the N frame image is set as the drift rate at the beginning of acquisition for the N frame image. It is possible to examine the drift characteristics of the image by referring to the graph. Thus, this graph may be output to the monitor 114 so that the operator can acknowledge the drift status.

Descriptions will now briefly be made of a phase correlation method as a process for calculating the drift rate. The phase correlation method is a correlation method using a phase components of a Fourier transform and a correlation method suitable for detecting the pattern edge position in an image with a low S/N ratio. Descriptions will later be made of procedures for calculating the amount of positional deviation of two images. A two-dimensional discrete Fourier transform is applied to each of the two target images for correlation calculation. Now, the phase spectrums of the two images are synthesized so as to form a phase difference images, and the synthesized image is inversely Fourier transformed. The analyzed image thus obtained has a delta peak. The position of the delta peak is calculated, thereby calculating the amount of positional deviation of the two images. In this manner, the phase correlation method is a method for calculating the correlation using only the phase components corresponding to the edge part of the images, without amplitude components corresponding to the brightness of the image. Therefore, it is possible to calculate the drift rate in the image pattern using the pattern edge part with high accuracy, even if a target frame image has an undesirable S/N ratio.

Figure 6:
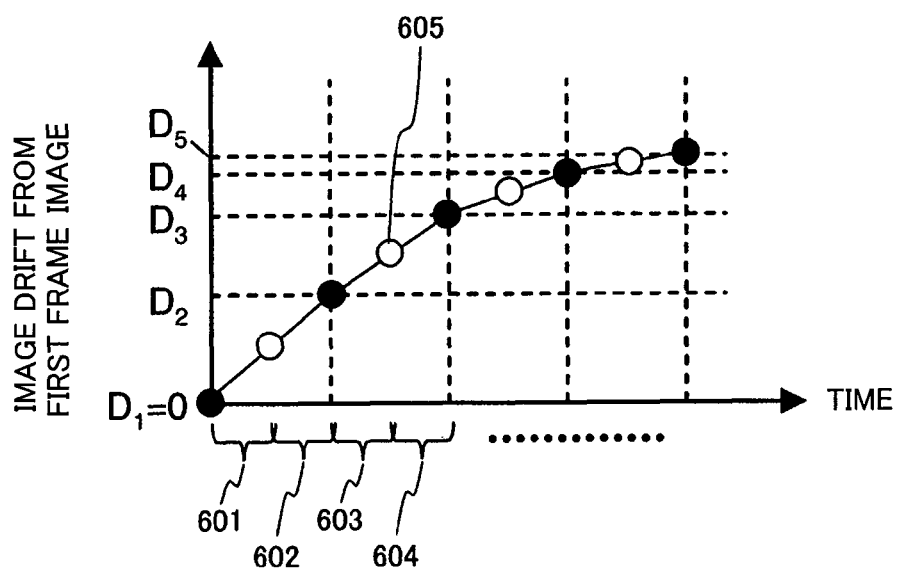
FIG. 6 is a diagram showing an image drift calculation method for frame images, in interlaced scanning.

Descriptions will be made of a conversion process for obtaining the drift rate between field images in step S403, with reference to FIG. 6. In this process, the drift rate between the field images is calculated based on the drift rate between frame images, calculated in step S402.

As illustrated in FIG. 3, the one-frame image is composed of two field images (odd number field images and even number field images), at the interlaced scanning. FIG. 6 shows a drift rate calculation method for field images. In step S402, the drift rate between frame images is calculated, and a graph similar to FIG. 5B is created. In this graph, the vertical axis represents the drift rate while the horizontal axis represents the time since the beginning of image acquisition. Plotted points are jointed by a straight line, and a new data point is plotted at midpoint of the two points (identified by "○" in the illustration). The graph obtained through the above procedures is shown in FIG. 6.

In the interlaced scanning, the acquisition time for the field image is only half the acquisition time for the one-frame image. The drift rate ("●" in the illustration) between the frame images, calculated in step S402, is equal to the drift rate at the measurement of odd number field images. In addition, the above-described drift rate ("○" in the illustration) is equal to the drift rate at the measurement of even number field images. The first frame image is decomposed into an odd number field image 601 and an even number field image 602. In this case, the odd number field image 601 is the reference image for drift correction. A data point 605 represents the drift rate of an even number field image 604 in the second frame image. At this data point, the drift rate $D_{2,2}$ can be obtained using Equation (1).

$$D_{2,2} = D_2 + (D_3 - D_2)/2 \qquad (1)$$

Figure 7A:
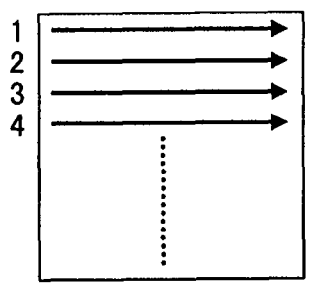
FIG. 7A is a diagram showing a scanning order in raster scanning.
Figure 7B:
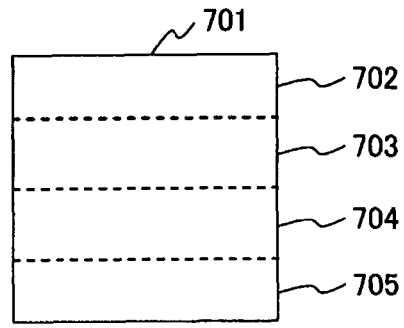
FIG. 7B is a diagram showing a frame image divided into four.

The descriptions have so far been made only of the interlaced scanning. However, any other different scanning method is applicable for obtaining the drift rate by decomposing the frame image into field images. As an example of a scanning method in the scanning electron microscope, descriptions will now be made of raster scanning that is a generally-used scanning method like the interlaced scanning. FIG. 7A is a diagram showing a scanning order in raster scanning. In the interlaced scanning, the even number lines are scanned after the odd number lines are scanned, so as to form a frame image. However, in the raster scanning, lines of a target image are scanned in order from the first line, so as to form an image. FIG. 7B is a diagram showing a frame image composed of 512 lines and divided into four field images at every 128 lines. A frame image 701 is divided into field images 702, 703, 704 and 705 having the same size. What is important here is that the field images are formed in time series. The result shows that the image is divided into four field images. However, another number of field images to be formed from the frame image may be applied. In this embodiment, the one frame image is formed of 512 lines. Thus, if the drift correction is performed, for example, 512 field images are necessary for every line.

Figure 7C:
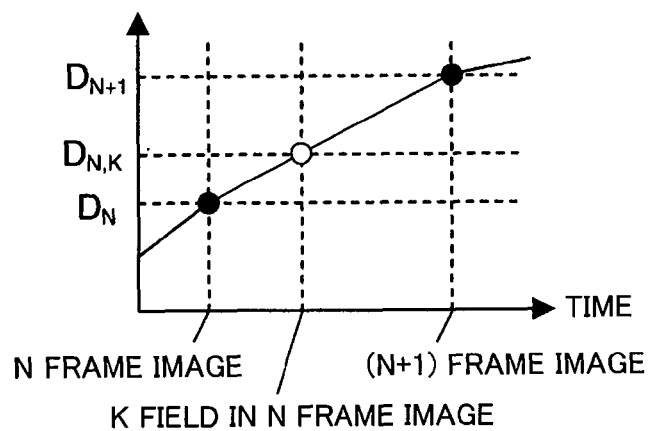
FIG. 7C is a diagram showing the relationship between elapsed times (since the beginning of image acquisition) and amounts of image drift, using a frame division method and a drift calculation method in raster scanning.

Descriptions will now be made of a method for obtaining the drift rate, when the number of divided field images is set as M, using FIG. 7C. The scanning time of the field images corresponds to 1/M of the scanning time of the frame image. Thus, the drift rate of each field is obtained by a linear equation.

$$D_{N,K} = D_N + (D_{N+1} - D_N) * (K-1)/M \qquad (2)$$

The acquisition time for a one-frame image is sufficiently short. A linear approximation is performed for the drift rate between frame images, using the drift rate of preceding and following frame images. However, a relationship may be obtained using a spline interpolation or plural frame data points, so as to interpolate between data points between the frame images.

Figure 8A:
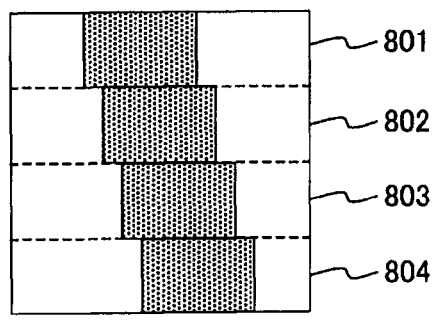
FIG. 8A is an exemplary diagram showing field images with a one-dimensional pattern drifted to the right with time.
Figure 8B:
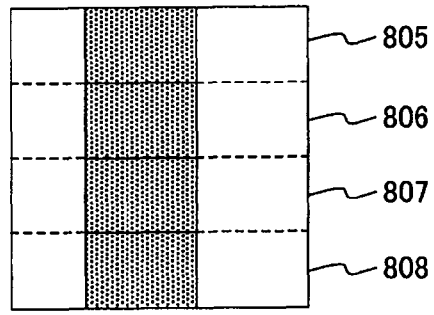
FIG. 8B is an exemplary diagram showing a frame image in which drift correction is made in the unit of field images.

FIG. 8A and FIG. 8B are exemplary diagrams each showing drift correction for field images with a one-dimensional pattern. FIG. 8A shows an example of a one-frame image obtained in accordance with a condition for drifting the pattern to the right with time. In this example, a one-frame image is formed of 801 to 804 field images. The position of the pattern in the field images 802 to 804 shifts to the right from the position of that of the field image 801. FIG. 8B shows a one-frame image after drift correction in the unit of field images using the field image 801, as a reference image, based on the drift rate of the field images obtained in FIG. 7C. In FIG. 8B, the position of the pattern of the field images 805 to 808 are symmetrically aligned. In addition, it is possible to correct the deviation of the pattern position that occurs as a result of image drift within one frame image.

In both the interlaced scanning method and the raster scanning method, a square pattern tends to be observed as a parallelogram pattern, for example. However, a frame image faithfully to the original pattern can be obtained using the field image correction.

FIG. 9 shows an example of a Graphical User Interface (GUI) for setting the environments suitable for image correction. At the image observation, it is determined with a switch whether the drift correction is performed. The correction method can be selected from the frame correction and the field correction. In the frame correction, the drift correction is limited to be performed in the unit of frame images. That is, the drift correction is performed for each frame image. On the contrary, in the field correction, the image is corrected in consideration of the drift in a one-frame image, in addition to the frame correction. In this case, it is possible to specify the unit number of field images. If the unit number of the field correction is specified as two, the one-frame image is divided into two field images. Then, the correction is performed for the divided two field images. With provision of an environment setting display described in this embodiment, a concrete drift correction method can arbitrarily be set. Note that the monitor 114 may commonly be used as a GUI.

In this embodiment, it is understood that the drift can be corrected during frame image acquisition, and a clear frame image can be obtained by performing the field image correction.

Further, in this embodiment, it is understood that the pattern dimensions can be measured with an error of 0.5% or less, by correcting the field images and accumulating images so as to form a new frame image, and by obtaining the pattern dimensions in the data handling unit using the frame image.

Second Embodiment

Descriptions will now be made of the second embodiment using FIG. 10 and FIG. 11. The contents of the first embodiment are applicable also to this embodiment, unless special circumstances are present.

Figure 10:
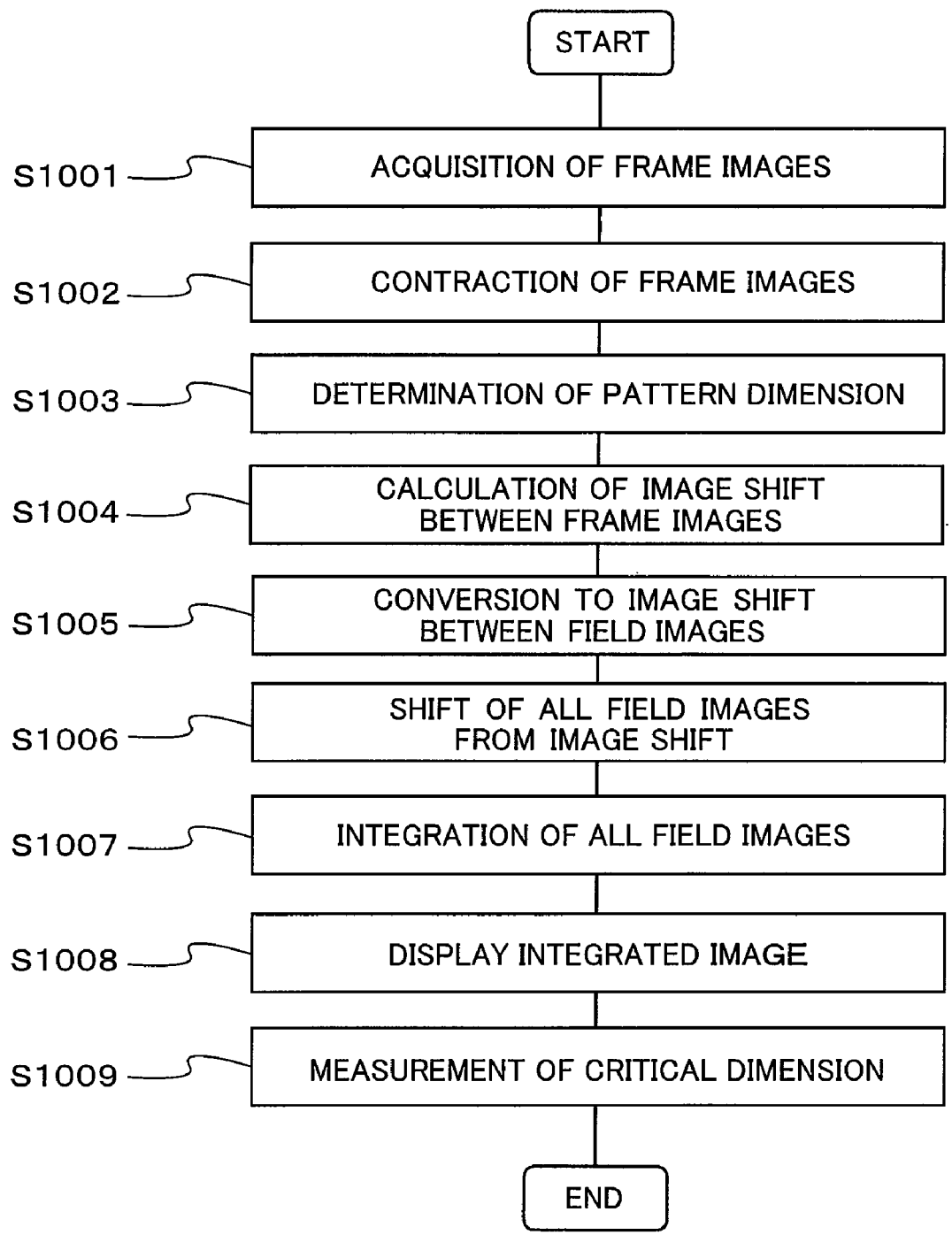
FIG. 10 is a flowchart showing the flow of drift correction in the second embodiment.

FIG. 10 is a flowchart showing the process of this embodiment. Descriptions will now be made of this flowchart.

The stage is moved to an observation point. Then, plural one-frame images are continuously acquired in the same field. The frame images thus acquired are stored in the image recording unit 112 (S1001).

The correction analyzing handling unit 113 is used for reducing the frame images so as to improve the S/N ratio (S1002).

The correction analyzing handling unit 113 is used for judging whether the pattern is one-dimensional or two-dimensional, using Computer Aided Design (CAD) data as design data corresponding to the target pattern to be observed or frame image data which has been acquired through the observation. In addition, an applicable analyzing method is determined (a calculation direction of the drift rate is determined) (S1003).

The correction analyzing handling unit 113 is used for obtaining the drift rate of the second and following frame images, based on the first frame image as a reference image (S1004).

The correction analyzing handling unit 113 is used for converting the drift rate of frame images, obtained in step S1004, into a drift rate between field images (S1005).

The correction analyzing handling unit 113 is used for shifting the field image(s) by the drift rate obtained in step S1005 (S1006). The shifted image(s) is superimposed and accumulated on the reference field image so as to form plural frame images (S1007).

The plural frame images formed in step S1007 are displayed on the monitor 114 (S1008).

After this, the pattern dimensions are obtained using the plural frame images displayed on the monitor 114 in step S1008 (S1009).

In step S1002 of this embodiment, by the reduction of the frame image, the S/N ratio can be improved by reducing the noise. Typical methods for reducing images include a nearest neighbor interpolation method, a bilinear method, and a bicubic method. These methods are respectively: for setting the nearest value to each pixel; setting a value by performing linear fitting using the surrounding four points of each pixel; and setting a value obtained by performing fitting with a third-order function using the surrounding sixteen points of each pixel. Descriptions will now be made of a bilinear method for reducing the noise by image reduction. For example, if the size of an image is reduced to half, the value of one pixel after reduction is obtained from the average value of the value of four pixels before reduction. That is, the image quality of the image after reduction is equal to that of the averaged image of four images before reduction. Accordingly, the noise can be decreased by reducing the image, resulting in improving the S/N ratio. However, when the image is reduced, the signal components are averaged, and the S/N ratio is reduced. Thus, it is necessary to set an appropriate reduction ratio for reducing the noise while minimizing the reduction of the signal.

In step S1004 of this embodiment, descriptions will now be made of a method for obtaining a drift rate when it is judged that the pattern is one-dimensional in step S1003. In the one-dimensional pattern, it is not possible to obtain the drift rate parallel to the longitudinal direction of the pattern. Thus, only the drift rate vertical to the longitudinal direction is obtained. The number of dimensions, for searching for the maximum point of the correlation values of two frame images, is reduced to one. Therefore, the time for calculating the correlation coefficients can be shorter than the calculation time in the normal two-dimensional searching.

Figure 11:
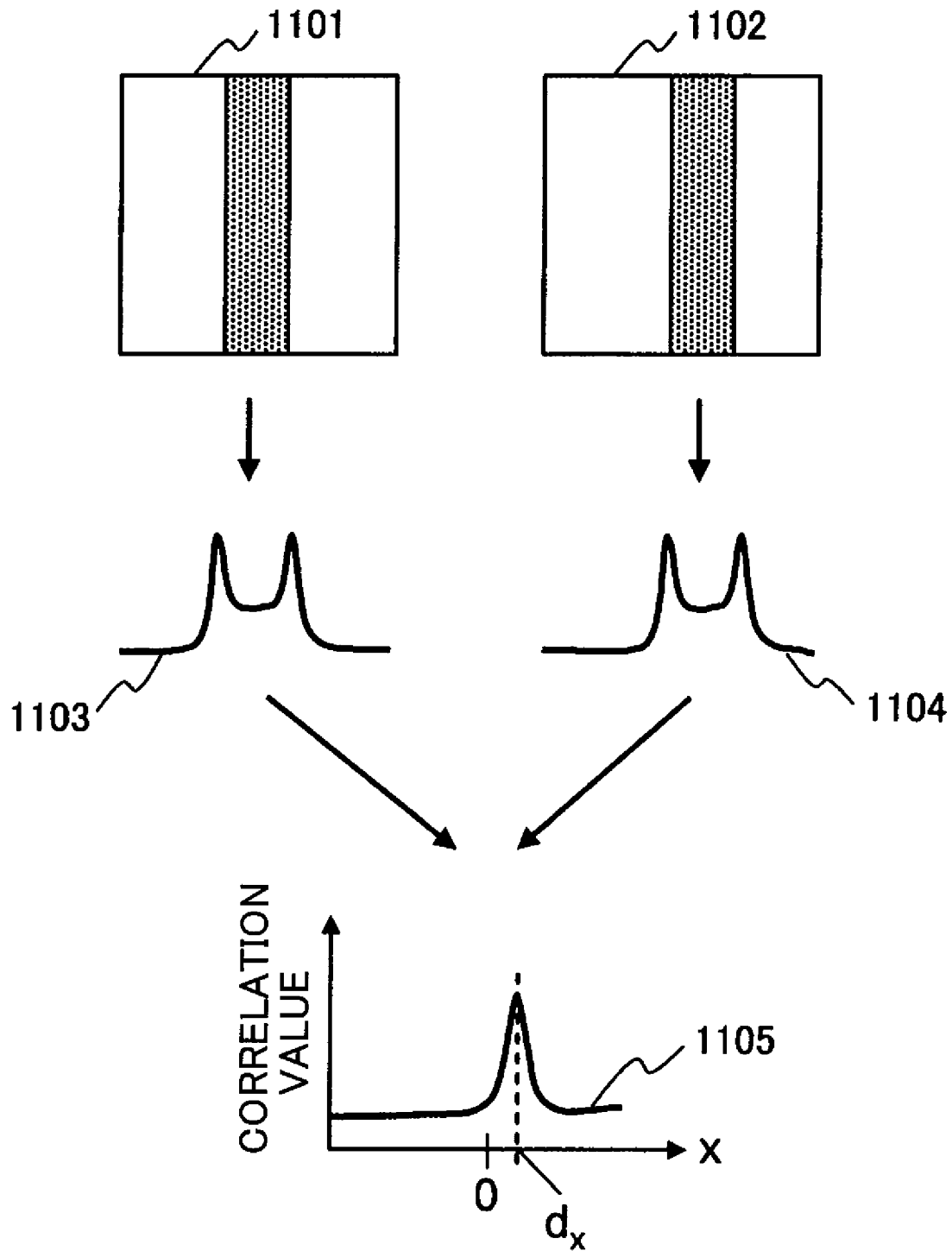
FIG. 11 is an exemplary diagram showing a drift calculation method in a one-dimensional pattern.

FIG. 11 shows an example of a method for calculating a drift rate of a one-dimensional pattern. In two frame images 1101 and 1102 having a line pattern in a perpendicular direction, the signal intensities are added together in a direction horizontal to the line, thereby forming one-dimensional line profiles 1103 and 1104. When the correlation coefficients between these one-dimensional line profiles are obtained, a graph 1105 can be obtained. This result shows that the frame image 1102 shifts to the right by $d_x$ from the frame image 1101. With this method, it is possible to calculate the drift rate in a short period of time with high accuracy as a result that: (1) the S/N ratio is improved because the profiles are formed by the above-described addition along the line; (2) the amount of original data for obtaining the correlation coefficients is decreased; and (3) the number of dimensions for searching for the correlation coefficients is decreased. It is possible to apply a technique for limiting the searching method for the drift rate only along the direction vertical to the line. On the other hand, the searching may be done using the two-dimensional frame images, without performing the above-described addition along the line. According to this technique, the amount of original data is not changeable, but the searching directions can be reduced. Thus, the calculation time can be reduced, though not as remarkable as the technique of FIG. 11.

However, in such techniques for calculating the drift rate for a reduced number of dimensions, no consideration is given to the drift in the longitudinal direction of the line. Thus, the techniques are not suitable for roughness measurement but are effective for obtaining the pattern dimensions, because the edge parts of the patterns are averaged when there is drift in the longitudinal direction. When the patterns include sufficient roughness, the drift rate can two-dimensionally be analyzed. Therefore, it is set that one-dimensional analysis is not performed in roughness measurement.

In this embodiment, like the first embodiment, a clear image is obtained, and the pattern dimensions can be measured with improved accuracy. Further, the frame image is reduced, thereby improving the S/N ratio of the image.

Third Embodiment

Descriptions will now be made of the third embodiment of the present invention. The contents of the first embodiment are applicable also to this embodiment, unless special circumstances are present.

In the first embodiment, the drift rate of each frame has been obtained, and the obtained drift rate is divided into the number of field images, so as to perform drift correction. In this technique, the calculation of the drift rate is made by comparing the one-frame images. However, the drift rate cannot be obtained with high accuracy between the one-frame images as they are when the S/N ratio is remarkably low. In consideration of this, according to one technique, correction is performed by superimposing plural one-frame images so as to form a new image, and obtaining a drift rate between these images with an improved S/N ratio. The minimum number of one-frame images to be superimposed is set so that an S/N ratio capable of obtaining the drift rate is obtained. In this case, the number of one-frame images may appropriately be two or three. However, the number may be more than two or three.

Figure 12:
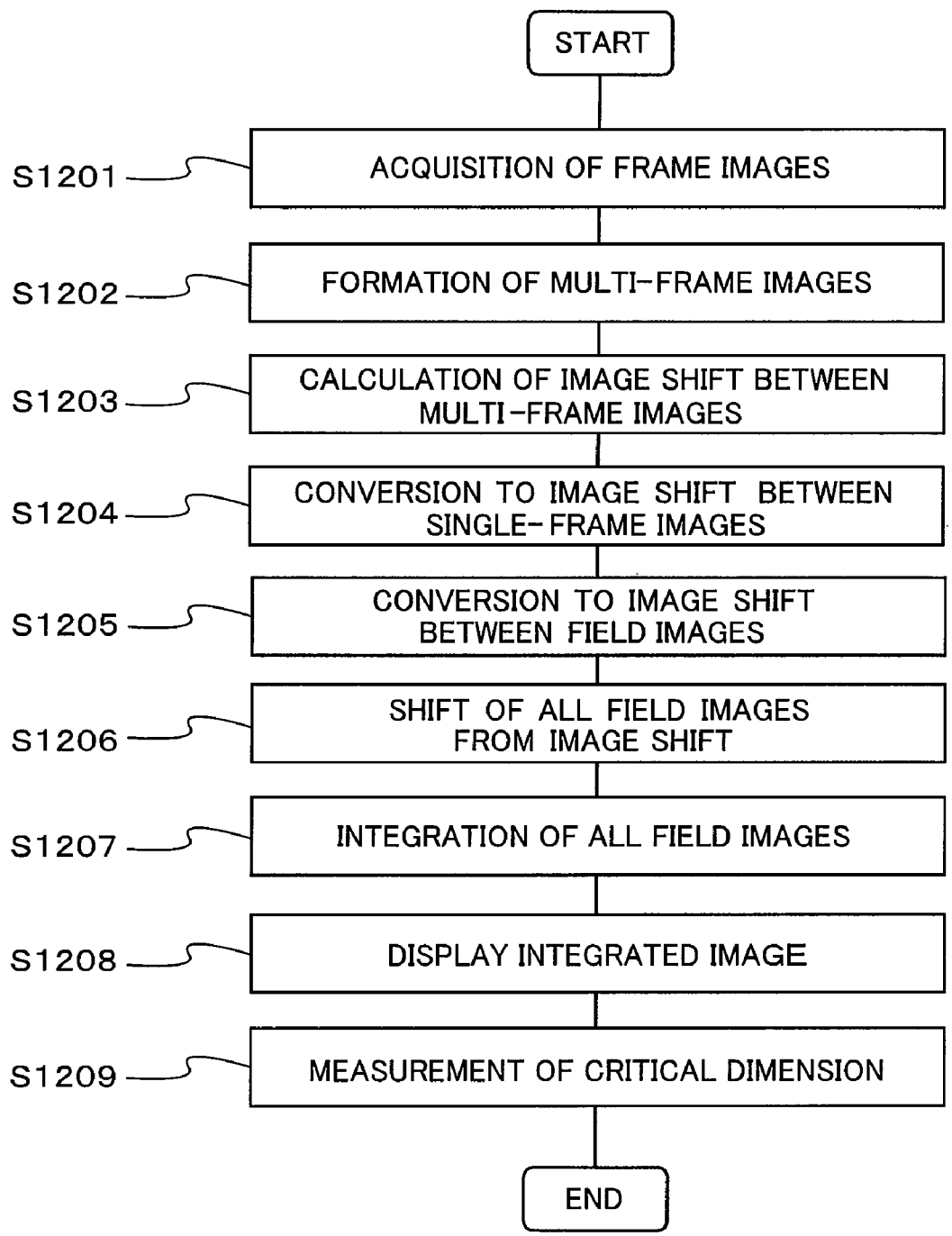
FIG. 12 is a flowchart showing the flow of drift correction in the third embodiment.

FIG. 12 is a flowchart showing the process flow in this embodiment. Descriptions will now be made of the process using this flowchart.

The stage is moved to an observation point. Plural one-frame images are continuously acquired in the same field. Then, the acquired frame images are stored in the image recording unit 112 (S1201).

The correction analyzing handling unit 113 is used for dividing the plural frame images stored in the image recording unit 112 into groups of several frame images. The frame images of each group are superimposed, so as to newly form plural frame images (S1202).

The correction analyzing handling unit 113 is used for obtaining the drift rate of the second and following frame images in relation to the first frame image (as a reference image) (S1203).

The correction analyzing handling unit 113 is used for obtaining the drift rate between the frame images, based on the drift rate between the plural frame images, which has been obtained in step S1203 (S1204).

The correction analyzing handling unit 113 is used for converting the drift rate between the frame images, which has been obtained in step S1204, into the drift rate between the field images (S1205).

The correction analyzing handling unit 113 is used for shifting the field image by the drift rate, which has been obtained in step S1205 (S1206). Then, the field image is superimposed and accumulated onto the reference field image, so as to form plural frame images (S1207).

The plural frame images formed in step S1207 are displayed on the monitor 114 (S1208).

After that, the pattern dimensions are obtained using the plural frame images displayed on the monitor 114 in step S1208 (S1209).

In this embodiment, like the first embodiment, a clear image can be obtained, and the pattern dimensions can be measured with improved accuracy. Further, plural one-frame images are superimposed so as to form a new image, thereby improving the S/N ratio of the image.

101 . . . electron microscope unit
102 . . . control unit
103 . . . display unit
104 . . . electron source
105 . . . condenser lens
106 . . . deflector
107 . . . objective lens
108 . . . sample
109 . . . sample holder
110 . . . detector
111 . . . data handling unit
112 . . . image recording unit
113 . . . correction analyzing handling unit
114 . . . monitor 1101 ... frame image
1102 ... frame image
1103 ... line profile of 1101
1104 ... line profile of 1102
1105 ... correlation function between 1103 and 1104

What is claimed is:

1. A scanning electron microscope which scans an electron beam, irradiates the electron beam onto a sample, and detects a signal emitted from the sample so as to form an image, the microscope comprising:
   an image recording unit that records a plurality of frame images each of which is acquired by scanning an observation field of the sample once;
   a correction analyzing handling unit that obtains a drift rate between the frame images and a drift rate between the field images included in each of the frame images; and
   a data handling unit that corrects the drift of the field images based on the drift rate between the field images, and superimposes the field images.

2. The scanning electron microscope according to claim 1, wherein the drift rate between the frame images is obtained by analyzing and calculating the frame images.

3. The scanning electron microscope according to claim 1, wherein the correction analyzing handling unit obtains the drift rate using a phase correlation method.

4. The scanning electron microscope according to claim 1, wherein the drift rate between the field images is obtained based on the drift rate between the frame images.

5. The scanning electron microscope according to claim 1, wherein the number of the field images included in one of the frame images can be set arbitrarily.

6. The scanning electron microscope according to claim 1, wherein the correction analyzing handling unit has a function for reducing the frame images.

7. The scanning electron microscope according to claim 1, wherein the correction analyzing handling unit has a function for judging whether a pattern in the observation field is one-dimensional or two-dimensional, using data of the frame image.

8. The scanning electron microscope according to claim 1, wherein the correction analyzing handling unit has a function for judging whether a pattern in the observation field is one-dimensional or two-dimensional, using CAD data corresponding to a target pattern to be observed.

9. The scanning electron microscope according to claim 1, wherein the field image is acquired by raster scanning.

10. The scanning electron microscope according to claim 1, wherein drift between the field images is corrected at one or a plurality of scanning lines.

11. The scanning electron microscope according to claim 1, wherein the drift rate between the frame images is obtained by dividing the plurality of frame images recorded in the image recording unit into groups of several images and accumulating the images of each of the groups so as to form several new frame images, and by using the several new frame images.

12. A scanning electron microscope which includes an electron beam source, a deflector which scans an electron emitted from the electron beam source, a sample holder on which a sample is put, and a display unit which displays an image based on a signal emitted from the sample, by the electron being irradiated onto the sample on the sample holder, and the microscope comprising:
   an image recording unit that stores a plurality of frame images acquired by the electron being irradiated to an observation field of the sample as an area to be observed;
   a correction analyzing handling unit that obtains a drift rate between the plurality of frame images and a drift rate between a plurality of field images included in each of the frame images; and
   a data handling unit that corrects drift of the field images based on the drift rate between the field images, and superimposes the field images so as to form a new frame image,
   wherein the data handling unit has a function for obtaining target pattern dimensions to be observed formed on the sample, based on data of the new frame image.

13. The scanning electron microscope according to claim 12, wherein the sample holder is fixed when the electron is irradiated to the observation field.

14. The scanning electron microscope according to claim 12, wherein the data of the new frame image includes a plurality of accumulated images.

* * * * *